United States Patent
Sakamoto et al.

(10) Patent No.: US 7,518,247 B2
(45) Date of Patent: Apr. 14, 2009

(54) SEMICONDUCTOR DEVICE AND ITS MANUFACTURING METHOD

(75) Inventors: Toshitsugu Sakamoto, Tokyo (JP); Hisao Kawaura, Tokyo (JP); Toshio Baba, Tokyo (JP); Fumiyuki Nihey, Tokyo (JP); Yukinori Ochiai, Tokyo (JP); Hiroo Hongo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/536,993

(22) PCT Filed: Dec. 1, 2003

(86) PCT No.: PCT/JP03/15322

§ 371 (c)(1),
(2), (4) Date: May 31, 2005

(87) PCT Pub. No.: WO2004/051726

PCT Pub. Date: Jun. 17, 2004

(65) Prior Publication Data

US 2006/0091557 A1     May 4, 2006

(30) Foreign Application Priority Data

Nov. 29, 2002   (JP) ............................. 2002-347753

(51) Int. Cl.
*H01L 23/48* (2006.01)
*H01L 23/52* (2006.01)
*H01L 29/40* (2006.01)

(52) U.S. Cl. ............... 257/773; 257/758; 257/E23.145; 257/E23.165; 257/E51.04

(58) Field of Classification Search ............... 257/758, 257/762, 773, 774, E23.145, E23.165, E51.04; 977/742
See application file for complete search history.

(56) References Cited

U.S. PATENT DOCUMENTS 5,036,382 A * 7/1991 Yamaha .................... 257/758
5,913,147 A * 6/1999 Dubin et al. ............... 438/687

(Continued)

FOREIGN PATENT DOCUMENTS

CN         1141506         1/1997

(Continued)

OTHER PUBLICATIONS

W. Hoenlein, New Prospects for Microelectronics: Carbon Nanotubes, Jpn. J. Appl. Phys. vol. 41 (2002) pp. 4370-4374.

*Primary Examiner*—Minh-Loan T Tran
*Assistant Examiner*—Leslie Pilar Cruz
(74) *Attorney, Agent, or Firm*—Young & Thompson

(57) ABSTRACT

There has been a problem that micromiaturization causes increase of the resistance of wiring structure and degradation of electron migration resistance and stress migration resistance. The present invention provides a wiring structure of a semiconductor device having a low resistance even when the semiconductor device is microminiaturized, free of electron migration and stress migration, and having a high reliability and a method for manufacturing the same. A semiconductor device having a wiring or a connection plug made of a mixture of a metal and carbon nanotubes berried in a wiring groove or a via hole made in an insulating film on a substrate where a semiconductor chip is fabricated, and its manufacturing method are provided.

5 Claims, 5 Drawing Sheets

U.S. PATENT DOCUMENTS

| | | | |
|---|---|---|---|
| 2001/0025962 A1 | 10/2001 | Nakamoto | |
| 2002/0163079 A1* | 11/2002 | Awano | 257/750 |
| 2002/0197752 A1* | 12/2002 | Choi | 438/20 |
| 2003/0211724 A1* | 11/2003 | Haase | 438/629 |

FOREIGN PATENT DOCUMENTS

| | | |
|---|---|---|
| GB | 2 298 657 | 9/1996 |
| JP | 11-139815 | 5/1999 |
| JP | 2001-181842 | 7/2001 |
| JP | 2001-283716 | 10/2001 |
| JP | 2002-8523 | 1/2002 |
| JP | 2002-329723 | 11/2002 |

* cited by examiner

SEMICONDUCTOR DEVICE AND ITS MANUFACTURING METHOD

TECHNICAL FIELD

The present invention relates to a semiconductor device and a method of manufacturing the semiconductor device and, more particularly, to a semiconductor device having a connection plug or an interconnection and a method of manufacturing the semiconductor device.

BACKGROUND ART

In a connection plug that connects interconnection materials or interconnections of a semiconductor device, low-resistance metals such as Cu or Al are used. With the scale down design of semiconductor devices moving ahead, the cross sections of interconnections and interconnection plugs decrease. As a result, the following phenomena have become more serious:

(1) Increase in the resistance values of interconnections and connection plugs (2) Electromigration of metal ions by current densities which have increased and (3) Stress migration due to heat cycles during manufacturing and heat generation etc. during working.

Electromigration and stress migration pose problems, such as changes with time in the resistance of metal interconnections and connection plugs and disconnections of them.

In order to prevent interconnections from being broken due to electromigration, there is available a method which involves using two materials in combination: an interconnection material A which has a low resistance value but is not resistant to migration (for example, Cu or Al) and an interconnection material B which has a high resistance value but is resistant to migration (for example, titanium, tungsten and suicide materials of these metals). In this case, the disconnection of interconnections can be prevented by the redundancy effect of the interconnection material B. However, this method is effective for interconnections although it is not effective for connection plugs. Also, although interconnections do not lead to disconnections, there is a problem that the interconnection resistance increases. Furthermore, this method is not effective for stress migration.

In contrast, there has been proposed a semiconductor device element in which carbon nanotubes having resistance to electromigration are used in connection plugs (Japanese Journal of Applied Physics, Vol. 41, pp. 4370 to 4374, 2002).

In this example, carbon nanotubes are formed in via holes and used as connection plugs that connect an upper interconnection layer and a lower interconnection layer together. Approximately 1000 carbon nanotubes are formed in a via hole of 5×30 micrometers square.

It is known that carbon nanotubes have high migration resistance and hence migration does not readily occur in carbon nanotubes.

When methods that involve combining interconnection materials are adopted, it is impossible to prevent the occurrence of voids due to the electromigration in connection plugs. Also, in interconnections, it is impossible to prevent changes in resistance that are caused of the disconnection of part of the interconnections due to electromigration or stress migration.

However, the reason why connection plugs formed from multilayer carbon nanotubes have high resistance values in spite of the fact that the multilayer carbon nanotubes have metallic properties and low resistance is that the contact resistance between the carbon nanotubes and the metal interconnections is high, with the result that the resistance of connection plugs increases due to the contact resistance even when the resistance of the carbon nanotubes is low.

The present invention provides an interconnection structure of a high-reliability semiconductor device which has a low resistance value even in the case of scale down design and does not produce electromigration and stress migration, and a method of manufacturing the interconnection structure.

DISCLOSURE OF THE INVENTION

According to the present invention, it is possible to provide a semiconductor device having an interconnection structure resistant to electromigration and stress migration.

Figure 1:
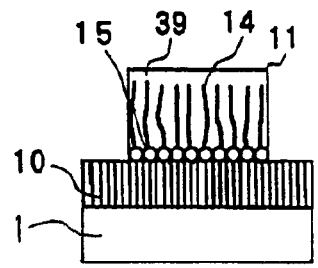
FIG. 1 is a schematic sectional view to show an interconnection structure in the first embodiment of the present invention.

The reference numerals used in the drawings will be described below.

The numeral 10 denotes an insulating film, the numerals 11, 51 an interconnection, the numerals 12, 29, 42, 49, 52 an interlayer dielectric film, the numerals 13, 28, 43, 48 a barrier metal layer, the numerals 14, 24, 44 a carbon nanotube, the numerals 17, 55 an interconnection trench, the numerals 15, 25, 45 a particle, the numerals 18, 32, 57 a seed layer, the numerals 19, 33, 39, 58 a metal layer, the numerals 26, 46 a connection plug, the numerals 16, 27, 30, 47, 50, 53 an etching stopper layer, the numerals 31, 56 a via hole, the numeral 54 a hole, the numerals 34, 59 a first interconnection layer, the numerals 35, 60 a connection plug layer, and the numeral 61 a second interconnection layer.

BEST MODE FOR CARRYING OUT THE INVENTION

The present invention provides an interconnection structure best suited to a semiconductor device which is manufactured according to a design rule with a line and space of not more than 0.1 µm. In the present invention, there is provided a semiconductor device in which a nanomaterial is substantially uniformly disposed in a section of a connection plug formed from a metal and, furthermore, a nanomaterial is substantially uniformly formed on a bottom surface of an interconnection formed from a metal.

The nanomaterial is a fibrous carbon nanomaterial, a particle-like carbon nanomaterial or a thin silicon wire.

These nanomaterials are oriented substantially perpendicularly to a substrate. Furthermore, it is preferred that these nanomaterials be disposed in the whole connection plug, and in the case of an interconnection, it is preferred that the nanomaterial be provided up to the vicinity of a top surface of the interconnection.

Furthermore, it is advantageous in terms of voids when the metal is formed by an MOCVD method or a plating method.

As a first manufacturing method, there is provided a method of manufacturing a semiconductor device which comprises the step of forming a metal of nanometer size on an insulating base, the step of causing a nanomaterial to grow on the metal of nanometer size, the step of depositing the metal on the substrate on which the nanomaterial has grown, and the step of working the metal including the nanomaterial into an interconnection.

As a second manufacturing method, a semiconductor device can be manufactured by the following steps. That is, there is provided a method of manufacturing a semiconductor device which comprises the step of forming a trench in an insulating base, the step of forming a metal of nanometer size at least on a bottom of the trench, the step of causing a nanomaterial to grow on the metal of nanometer size, the step of depositing the metal so that the trench is embedded with the metal, and the step of working the metal including the nanomaterial into an interconnection.

In this case, the insulating base may have an interconnection in a lower layer or a device element formed on the semiconductor substrate and at least part of the lower-layer interconnection or the element may be exposed to part of the bottom of the trench formed in the insulating base.

The metal of nanometer size becomes a nucleus which causes the nanomaterial to grow, and the metal of nanometer size is any of iron, platinum, nickel, cobalt or silicide substances of nickel and cobalt, and iron oxides.

The nanomaterial is a fibrous carbon nanomaterial, a particle-like carbon nanomaterial or a thin silicon wire.

In the step of depositing the metal, it is advantageous to deposit the metal by a plating method or an MOCVD method in terms of voids.

Embodiments of the present invention will be described.

When an excessive current is caused to flow through an interconnection and a connection plug which are formed from a metal alone, electromigration occurs, which is a phenomenon that metal ions migrate on an electron flow. On the other hand, if a nanomaterial having high mechanical strength, such as a carbon nanotube, for example, is present in a place to which metal ions migrate, the migration of the metal ions is suppressed. That is, electromigration is suppressed.

In metals having low electric resistance used in the interconnections and connection plugs of present semiconductor device elements, such as gold, silver, copper and aluminum, atoms thereof are bonded by metallic bonds. In contrast, the atoms that constitute nanomaterials, such as a fullerene, a carbon nanotube, a carbon nanohorn and a thin silicon wire, are bonded by covalent bonds.

Carbon materials having such a structure that only the leading end of a carbon nanotube protrudes from a carbon aggregate, such as the carbon nanohorn disclosed in the Japanese Patent Laid-Open No. 2001-64004, have been manufactured or discovered as one form of carbon nanomaterial.

Because carbon nanomaterials are formed from covalent bonds, which have higher bonding strength than metallic bonds, separation requires great energy. Therefore, covalent bonds have higher mechanical strength and electromigration resistance than metallic bonds.

Table 1 shows a comparison of mechanical strength and Young's modulus between conventionally used Cu and Al and a carbon nanotube.

TABLE 1

| Material | Electric resistivity ($\times 10^{-6}$ Ωcm) | Young's modulus ($\times 10^{12}$ Pa) |
| --- | --- | --- |
| Al | 2.74 | 0.068 |
| Cu | 1.70 | 0.126 |
| Carbon Nanotube | <0.1 | ~1 |

Carbon fibers represented by a single-layer carbon nanotube and a multilayer carbon nanotube, carbon materials represented by a fullerene, a carbon nanohorn, etc., and a thin silicon wire can be enumerated as nanomaterials.

It is necessary only that carbon nanotubes have a diameter of not more than 100 nm and an aspect ratio of not less than 10.

A thin silicon wire is a fibrous material made of silicon having a diameter of 1 to 100 nm and an aspect ratio of not less than 10.

Among these nanomaterials, particularly, fibrous materials have the function of preventing the breakage of connection plugs and interconnections that occur due to mechanical stress and temperature stress during manufacture. Because fibrous structures having high mechanical strength are contained in the metals that constitute connection plugs and interconnections, as with the relationship between reinforcing bars and concrete in a building, fibrous structures (reinforcing bars) increase the strength of a metal (the framework of a building) and protect connection plugs and interconnections (the building) from vibrations from outside and thermal shrinkage.

In the case of a carbon nanotube, a multilayer carbon nanotube exhibits metallic properties. On the other hand, by selecting chirality, which shows how a carbon sheet is wound, a single-layer carbon nanotube exhibits metallic properties and its resistivity becomes very small.

The resistivity of a carbon nanotube in the case that it exhibits metallic properties is shown in Table 1.

When chirality becomes different, a single-layer carbon nanotube exhibits metallic properties or semiconducting properties. Although it is difficult to control chirality with the current techniques, the superiority of the present invention is not demolished even when a semiconducting single-layer carbon nanotube is contained at an appropriate ratio. This is because the connection plug and interconnection of the present invention are formed from a mixed material of a carbon nanotube and a metal and an increase in resistance can be prevented by the fact that a current flows through the metal part. Also, because the surface of a carbon nanotube is covered with the metal, the contact resistance of the connection plug and the interconnection can be reduced.

The carbon nanotube used in the present invention may be either a multilayer carbon nanotube or a single-layer carbon nanotube. A multilayer carbon nanotube can be easily formed by the CVD method. Furthermore, carbon nanotubes are not subject to constraints on quantification by being a thin wire and, therefore, carbon nanotubes have the advantage that they have always metallic properties.

Next, embodiments of the present invention will be described in detail with reference to the drawings.

First Embodiment

The description will be given by using FIG. 1 that is a schematic sectional view of an interconnection structure in a semiconductor device of the first embodiment.

In FIG. 1, an interconnection 11 is constituted by a metal layer 39, which is formed on an insulating film 10 formed on a semiconductor substrate 1 on which a device element or an interconnection is formed. Carbon nanotubes 14 are mixed in the metal layer 39 which constitutes the interconnection 11. The carbon nanotube 14 is formed on a particle 15 of nickel formed on the insulating film 10. The particle 15 acts as a catalyst during the growth of the carbon nanotube, and the carbon nanotube 14 grows, with the particle 15 serving as a nucleus.

A manufacturing method of a semiconductor device of the first embodiment will be described with reference to FIGS. 2(a) to 2(c).

(Formation of Substrate and Formation of Carbon Nanotubes)

The insulating film 10 is formed on a silicon substrate 1 on which a semiconductor device element is formed.

The insulating film 10 is a film having a film thickness of 20 nm formed by the thermal oxidation method or the CVD method, and this is a film formed from an oxide film, a nitride film, an oxynitride film, etc.

Next, particles 15 are formed on the insulating film 10 by using Ni having a film thickness of 2 to 10 nm formed by the sputtering method.

Figure 2:
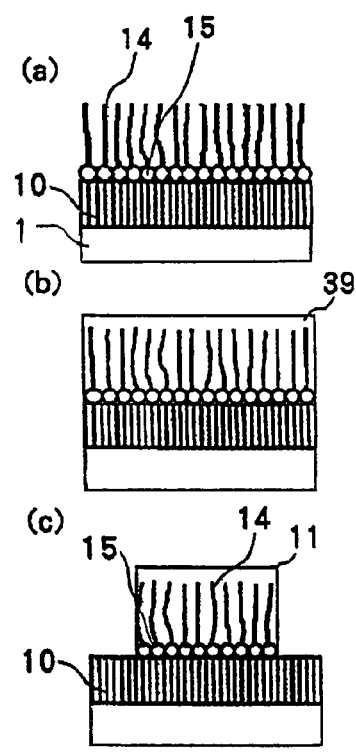
FIGS. 2(a) to 2(c) are each a schematic sectional view to explain each step of a manufacturing method of an interconnection in the first embodiment of the present invention.

After that, carbon nanotubes 14 are caused to grow on the particles 15, with the particles 15 serving as nuclei (FIG. 2(a)).

The particle 15 is in the form of a granule of nanometer size, and metals, metal suicides and metal oxides can be used. Iron, platinum, cobalt or silicide substances of cobalt and nickel or oxides, etc. are also known in addition to nickel.

The granular particle 15 of nanometer size is obtained by forming a film of 2 to 10 nm. The evaporation method and the chemical vapor deposition method may be used in addition to the sputtering method.

The carbon nanotube 14 may be fibrous carbon nanomaterials represented by a single-layer carbon nanotube, a multi-layer carbon nanotube, etc., granular carbon nanomaterials represented by a carbon nanohorn and a fullerene, and a thin silicon wire.

The carbon nanotube is caused to grow by the thermal CVD method or the plasma CVD method. When the thermal CVD method is used, the nanotube tends to come to an entangled condition. In order to increase the strength of an interconnection, the nanotube is advantageous when it is in an entangled condition.

On the other hand, when the plasma CVD method is used, it is possible to cause the carbon nanotube to be oriented perpendicularly to the substrate.

Growth conditions by the plasma CVD method are exemplified below:
  Process gas: Mixed gas of acetylene and ammonia
  Gas pressure: 3 to 20 torr
  Substrate temperature: 400 to 500 degrees
  DC power: 100 to 200 W Growth conditions by the thermal CVD method are exemplified below:
  Process gas: Methane
  Gas pressure: 0.1 to 1 atm
  Growth temperature: 500 to 800 degrees (Formation of Interconnection)

An Al—Cu alloy (cu 5%), which is an Al-based alloy, was deposited as the metal layer 39 by the sputtering method on the insulating film 10 in a film thickness of 600 nm (FIG. 2(b)).

The metal layer 39 may be formed from Al, Cu, Ag, Al-based alloys (for example, Al—Si, Al—Si—Cu, etc.), Cu-based alloys (Cu—Ag etc.) and the like. The plating method and the MOCVD (metal organic chemical vapor deposition) method may be used in addition to the sputtering method.

There is a correlation between the density of carbon nanotubes and the frequency of occurrence of voids during the deposition of the metal layer 39, and the higher the density, the higher the frequency of occurrence of voids. Voids may sometimes burst due to thermal expansion, thereby lowering the reliability of a semiconductor device. The growth of voids must be suppressed.

Voids can be suppressed by (1) a method which involves causing carbon nanotubes to be perpendicularly oriented and (2) a method which involves lowering the density of carbon nanotubes. The two methods (1) and (2) may be used in combination.

The density of carbon nanotubes can be controlled by changing the film thickness of Ni or the like. The density of carbon nanotubes is lowered, for example, by reducing the film thickness of Ni.

Lastly, the interconnection 11 is formed by using a lithography technique and an etching technique which are publicly known (FIG. 2(c)).

In the case of this first embodiment, the stress migration resistance increases when the carbon nanotubes in the interconnection are provided up to the vicinity of a top surface of the interconnection. On the other hand, when the carbon nanotubes are substantially uniformly provided on the bottom surface, this is effective for the resistance to electromigration. Therefore, a granular carbon nanomaterial such as a carbon nanohorn may be used.

Second Embodiment

The second embodiment of the present invention is an interconnection trench structure by the single damascene process.

Figure 3:
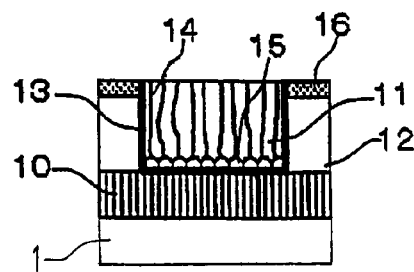
FIG. 3 is a schematic sectional view to show an interconnection structure by the single damascene process in the second embodiment of the present invention.

FIG. 3 shows an interconnection structure by the single damascene process.

The interconnection structure by the single damascene process will be described. There are formed an insulating film 10, which is formed on a semiconductor substrate 1 on which a device element or an interconnection is formed, an interlayer dielectric film 12 formed on the insulating film 10, and an etching stopper layer 16.

An interconnection 11 is formed in a trench which is formed in the interlayer dielectric film 12 and the etching stopper layer 16. The interconnection 11 has particles 15 formed on a barrier metal layer 13 and carbon nanotubes 14 which are caused to grow on the particles 15, and is embedded with a metal layer 39.

The particle 15 may be formed from Fe or Ni and the carbon nanotube 14 may be formed from a carbon fiber, such as a carbon nanotube, a thin silicon wire, etc.

Next, a method of manufacturing an interconnection structure by the single damascene process will be described with reference to FIGS. 4(a) to 4(g).

(Formation of Interconnection Trench 17)

The insulating film 10, the interlayer dielectric film 12 formed on the insulating film 10, and the etching stopper layer 16 formed from SiC (film thickness 30 nm) by the plasma CVD method on the interlayer dielectric film 12 are formed on a silicon substrate 1 on which a semiconductor device element is formed. The etching stopper film 16 works also as a diffusion preventing film that prevents a metal which becomes an interconnection from diffusing into the insulating film.

The insulating film 10 (film thickness 300 nm) may be an oxide film formed by the thermal oxidation of the silicon substrate or an oxide film, a nitride film and an oxynitride film formed by the CVD method (the chemical vapor deposition method).

The interlayer dielectric film 12 (film thickness 600 nm) may be a silicon oxide film, a silicon nitride film and a silicon oxynitride film formed, for example, by the CVD method or may be an organic substance having low permittivity and high voltage resistance, such as divinylsiloxane benzocyclobutene which is disclosed in the Japanese Patent Laid-Open No. 2002-118169, for example. Because interconnection intervals have narrowed due to scale down design, research on organic materials having low permittivity and high voltage resistance has been widely conducted in order to lower the interconnection capacitance.

It is preferred that the etching stopper layer 16 have a higher etching rate than the interlayer dielectric film, and furthermore, it is necessary for the etching stopper layer to work also as a diffusion preventing film which prevents metal atoms from diffusing into the insulating film. A silicon nitride film, a silicon oxynitride film, etc. are preferable as the etching stopper layer in addition to SiC (FIG. 4(a)).

Figure 4:
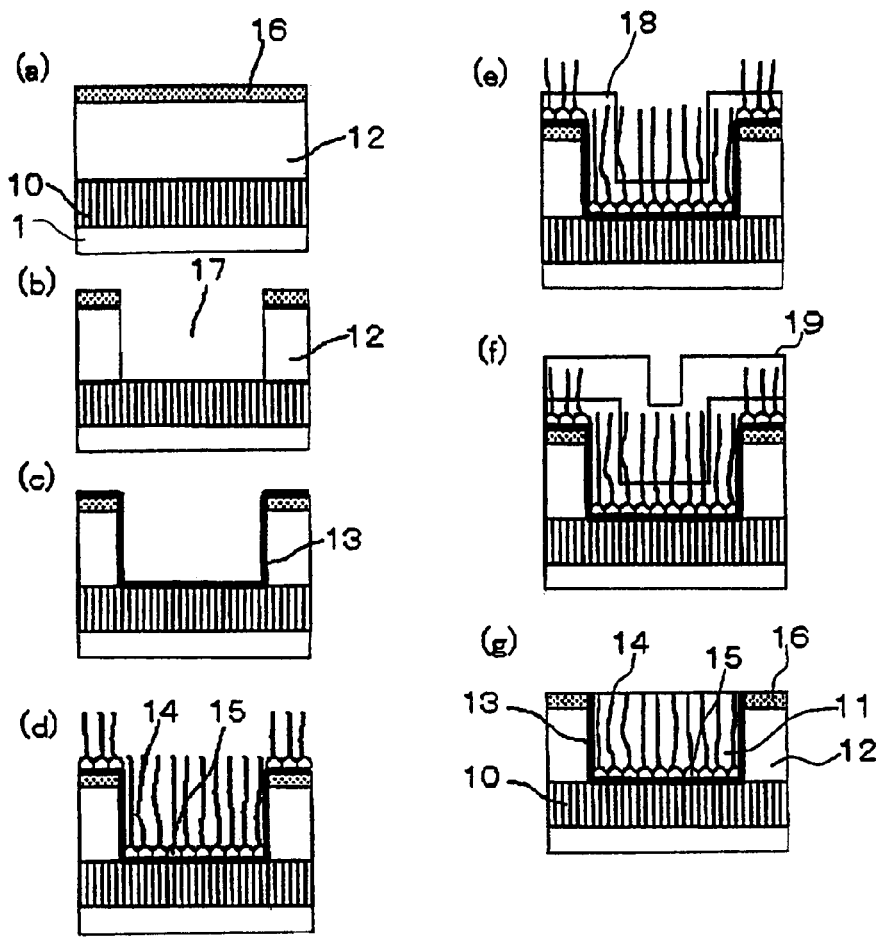
FIGS. 4(a) to 4(g) are each a schematic sectional view to explain each step of a manufacturing method of an interconnection by the single damascene process in the second embodiment of the present invention.

After that, an interconnection trench 17 is formed by using a lithography technique and an etching technique which are publicly known (FIG. 4(b)).

(Formation of Barrier Metal)

Ta having a film thickness of 50 nm is formed by the sputtering method as a barrier metal layer 13 on the whole surface of the substrate 10 including the interconnection trench 17 (FIG. 4(c)).

The barrier metal layer 13 is a film which prevents metal atoms from diffusing into the insulating film. Ti, TiN or a two-layer structure of Ti and TiN (Ti being a lower layer) or Ta, TaN or a two-layer structure of Ta and TaN (Ta being a lower layer) and the like are preferable.

(Formation of Carbon Nanotubes)

In the same manner as in the first embodiment, particles 15 are formed in a bottom portion of the interconnection trench 17 by using Ni having a film thickness of 2 to 10 nm formed by the sputtering method. After that, carbon nanotubes are formed on the particles 15, with the particles 15 serving as nuclei. The carbon nanotubes are caused to grow to such an extent that they protrude from the interconnection trench 17 (800 nm or so) (FIG. 4(d)).

(Formation of Interconnection)

Cu having a film thickness of 50 nm is formed as a seed layer 18 (FIG. 4(f)), a metal layer 19 of 650 nm formed from Cu is deposited by the plating method, and the metal layer having a total thickness of 700 nm formed from a Cu layer is formed on the barrier metal layer 13.

The MOCVD method (the metal organic chemical vapor deposition method) may be used in the formation of the seed layer 18.

When the metal layer 19 is formed by the MOCVD method (the metal organic chemical vapor deposition method), the formation of the seed layer 18 may be omitted.

Voids are less apt to occur in the plating method and the MOCVD method than in the sputtering method.

The interconnection 11 is constituted by the seed layer 18 and the metal later 19.

In the case of trench interconnection, Cu and Ag or Cu-based alloys (Cu—Ag etc.), Ag-based alloys (Ag—Cu etc.), etc. are more frequently used than Al and Al-based alloys.

Lastly, excess Cu layers, carbon nanotubes and Ni other than those in the interconnection trench 17 are removed by use of the publicly known CMP method (the chemical mechanical polishing method) and the interconnection 11 is formed. In the CMP method, a polishing solution (a slurry) obtained by mixing hydrogen peroxide with an abrasive, the main component of which is silica, is used (FIG. 4(g)).

The seed layer 18 may have the same composition as the metal layer 19 or may have a different composition from that of the metal layer.

Next, the structure of a connection plug that connects a lower-layer interconnection and an upper-layer interconnection together will be described by using drawings.

There is provided a connection plug layer 35 which connects an interconnection 11 formed in a first interconnection layer 34 (which is formed in the interlayer dielectric film 12).

The structure of a connection plug which connects with the interconnection 11 of the lower layer will be described with reference to FIG. 5.

Figure 5:
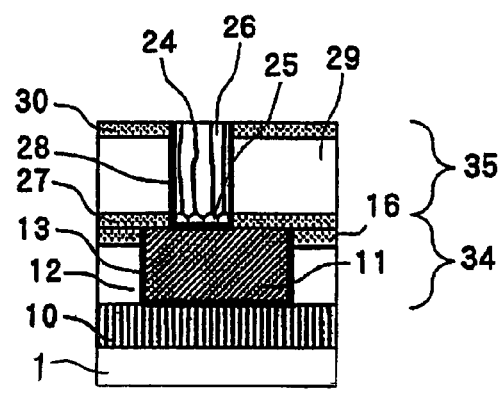
FIG. 5 is a schematic sectional view to show the structure of a connection plug by the single damascene process in the second embodiment of the present invention.

In FIG. 5, the same numerals are given to the same parts as used in FIG. 3.

Incidentally, although carbon nanotubes are not mixed in the interconnection 11 of FIG. 5, carbon nanotubes 14 may be mixed as shown in FIG. 3.

The first interconnection layer 34 is constituted by the interlayer dielectric layer 12, the interconnection 11, the barrier metal layer 13, and etching stopper layers 16 and 27.

The connection plug 35 on the first interconnection layer 34 is constituted by an interlayer dielectric film 29, a connection plug 26, a barrier metal layer 28, particles 25 and an etching stopper layer 30. Carbon nanotubes 24 are mixed in the connection plug 26.

In FIG. 5, an upper-layer interconnection to be connected to the connection plug is not formed. However, the upper-layer interconnection can also be formed by the same manufacturing method as in FIGS. 4(a) to 4(g).

Because structures having high mechanical strength and high resistance to electromigration such as carbon nanotubes are contained in the connection plug, electromigration does not occur even when structures having high mechanical strength and high resistance to electromigration such as carbon nanotubes are not contained in the upper-layer interconnection or the lower-layer interconnection.

On the other hand, it is effective for stress migration to mix structures having high mechanical strength in the metal from which an interconnection is formed.

A manufacturing method of a connection plug of an interconnection structure in the second embodiment will be described below with reference to FIGS. 6(a) to 6(g).

(Formation of First Interconnection Layer and Via Hole)

The insulating film 10 formed on a silicon substrate 1 on which a semiconductor device element is formed, the interlayer dielectric film 12 formed on the insulating film 10, and the interconnection 11 formed in a trench portion, which is formed in the interlayer dielectric film 12 formed on the insulating film 10 and this first interlayer dielectric film 12 are formed from the barrier metal layer 13 and a metal. The etching stopper layers 16 and 27 are formed on the interlayer dielectric film 12. The interlayer dielectric film 29 and the etching stopper layer 30 are formed on the etching stopper layer 16 (FIG. 6(a)).

The interlayer dielectric film 29 is formed in the same manner as the interlayer dielectric film 12.

Figure 6:
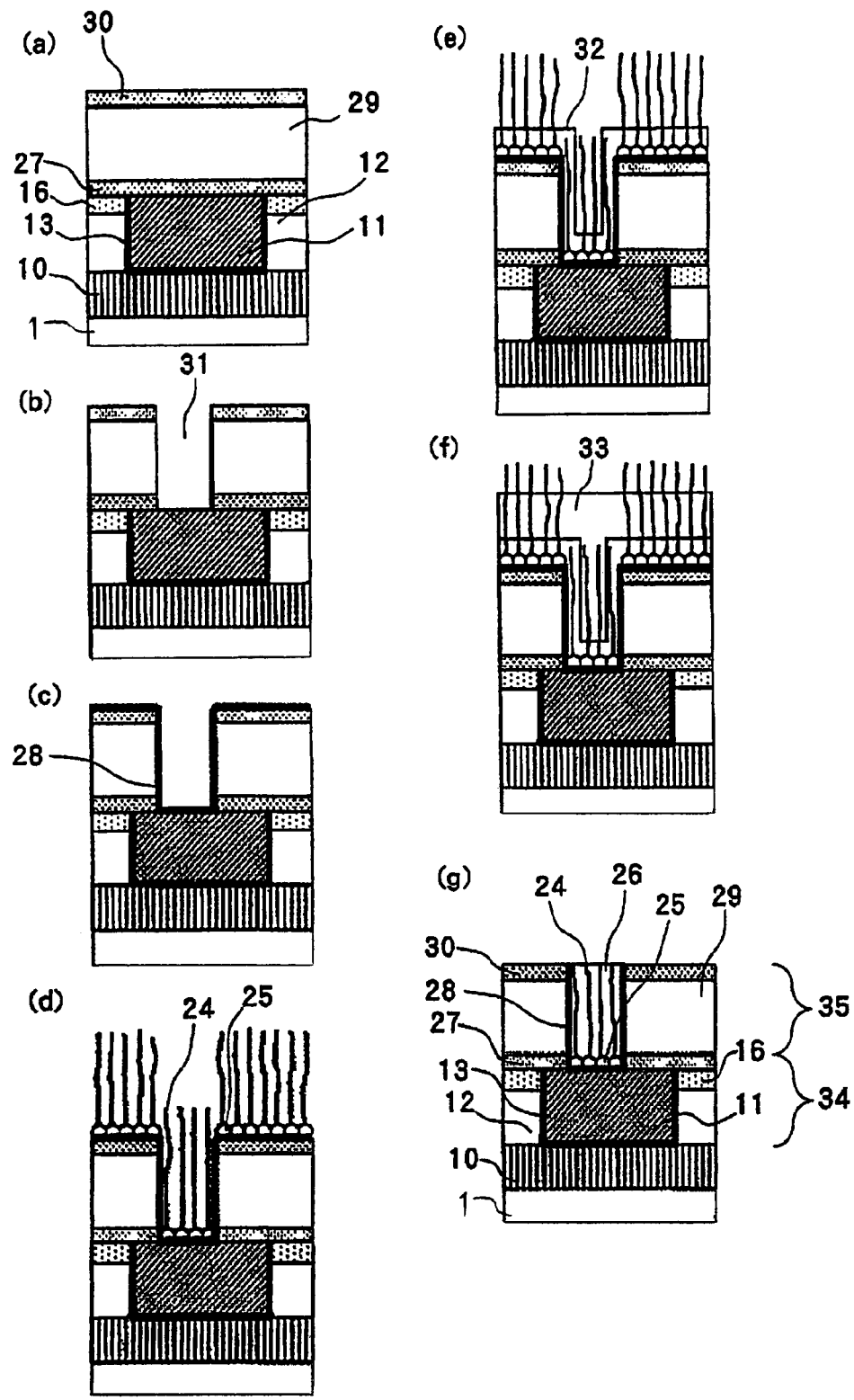
FIGS. 6(a) to 6(g) are each a schematic sectional view to explain each step of a manufacturing method of a connection plug by the single damascene process in the second embodiment of the present invention.

After that, a via hole 31 is formed by using a photolithography technique and an etching technique which are publicly known (FIG. 6(b)).

(Formation of Barrier Metal)

In the same manner as with the trench interconnection, Ta having a film thickness of 10 to 30 nm is formed as the barrier metal layer 28 by the sputtering method on the whole surface of the substrate including the via hole 31 (FIG. 6(c)).

(Formation of Carbon Nanotubes)

Ni which becomes the particles 25 and the carbon nanotubes 24 are formed. The carbon nanotubes are caused to grow to such an extent that they protrude from the via hole 31 (800 nm or so) (FIG. 6(d)).

(Formation of Interconnection)

Cu having a film thickness of 30 nm is formed as a seed layer 32(FIG. 6(e)), a metal layer 33 of 670 nm formed from Cu is deposited by the plating method, and a Cu layer having a total thickness of 700 nm is formed on the Ta film (FIG. 6(f). The MOCVD method (the metal organic chemical vapor deposition method) may be used in the formation of the seed layer and the Cu layer. Lastly, excess Cu layers, carbon nanotubes and Ni other than those in the via hole are removed by use of the CMP method, which is a conventional technique, and the connection plug 26 is formed (FIG. 6(g)).

The connection plug 26 can be manufactured in the same manner as with the interconnection 11 described in FIGS. 4(a) to 4(g).

Third Embodiment

In the third embodiment, a description is given of a trench interconnection structure by the dual damascene process in which an interconnection and a connection plug are simultaneously formed.

An interconnection structure by the dual damascene process will be described with reference to FIG. 7.

Figure 7:
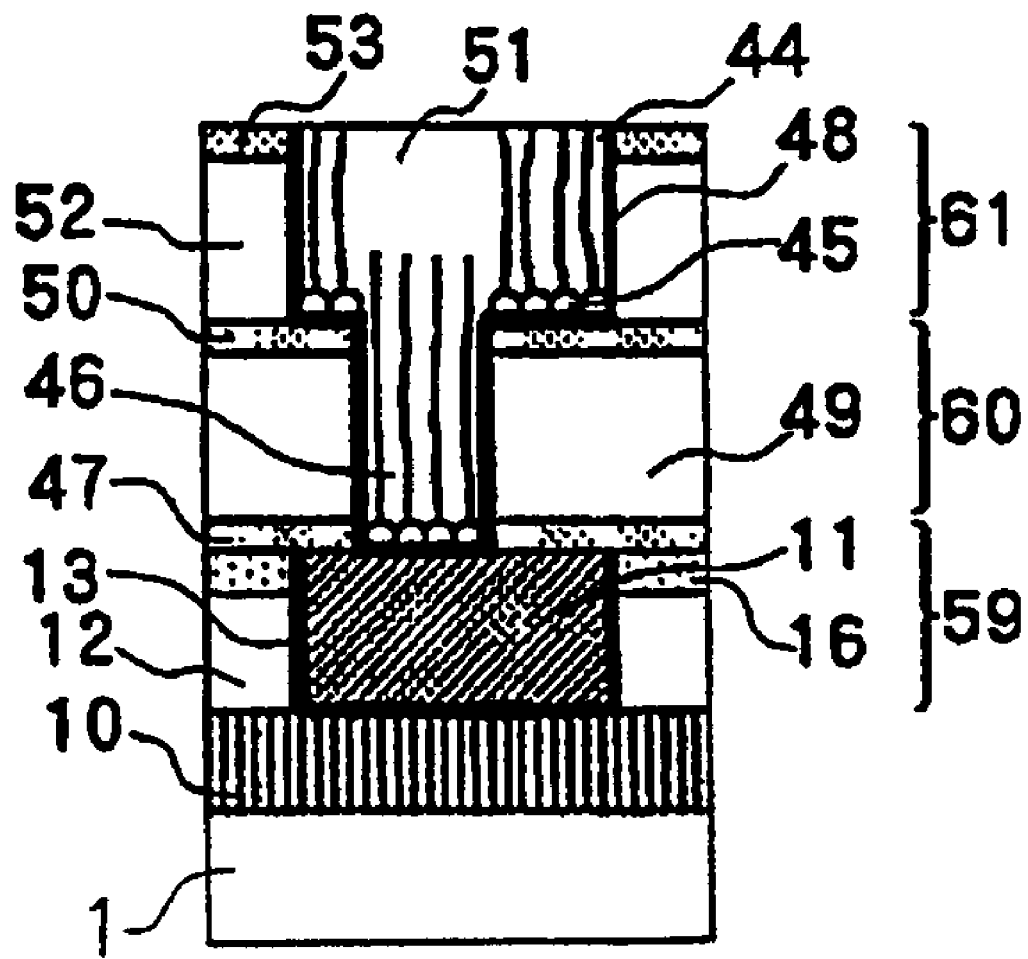
FIG. 7 is a schematic sectional view to show an interconnection and a connection plug by the dual damascene process in the third embodiment of the present invention.

Also in FIG. 7, the same numerals are given to the same parts as used in FIGS. 3 and 5.

Incidentally, although carbon nanotubes are not mixed in the interconnection 11 of FIG. 7, carbon nanotubes 14 may be mixed as shown in FIG. 3.

A first interconnection layer 59 is constituted by an interlayer dielectric layer 12, an interconnection 11, a barrier metal layer 13, and etching stopper layers 16 and 47.

This embodiment provides, on an insulating film 10 formed on a substrate 1 including a semiconductor device element, the first interconnection layer 59, a connection plug 60 and a second interconnection layer 61. The first interconnection layer 59 is constituted by the interlayer dielectric layer 12, the interconnection 11, the barrier metal layer 13, and the etching stopper layers 16 and 47.

The connection plug 60 on the first interconnection structure is constituted by an interlayer dielectric film 49, a connection plug 46, a barrier metal layer 48, particles 45 and an etching stopper layer 50. Carbon nanotubes 24 are mixed in the connection plug 46.

The second interconnection layer 61 is constituted by an interlayer dielectric film 52, an interconnection 51, a barrier-metal layer 48, and an etching stopper layer 53. Carbon nanotubes 44 are mixed in the interconnection 51.

A manufacturing method by the dual damascene process, which is the third embodiment of the present invention, will be described below with reference to FIGS. 8(a) to 8(h).

(Formation of First Interconnection Layer and Via Hole)

The first interconnection layer 59 excluding the etching stopper layer 47 is formed by using the same method as used in the second embodiment.

Figure 8:
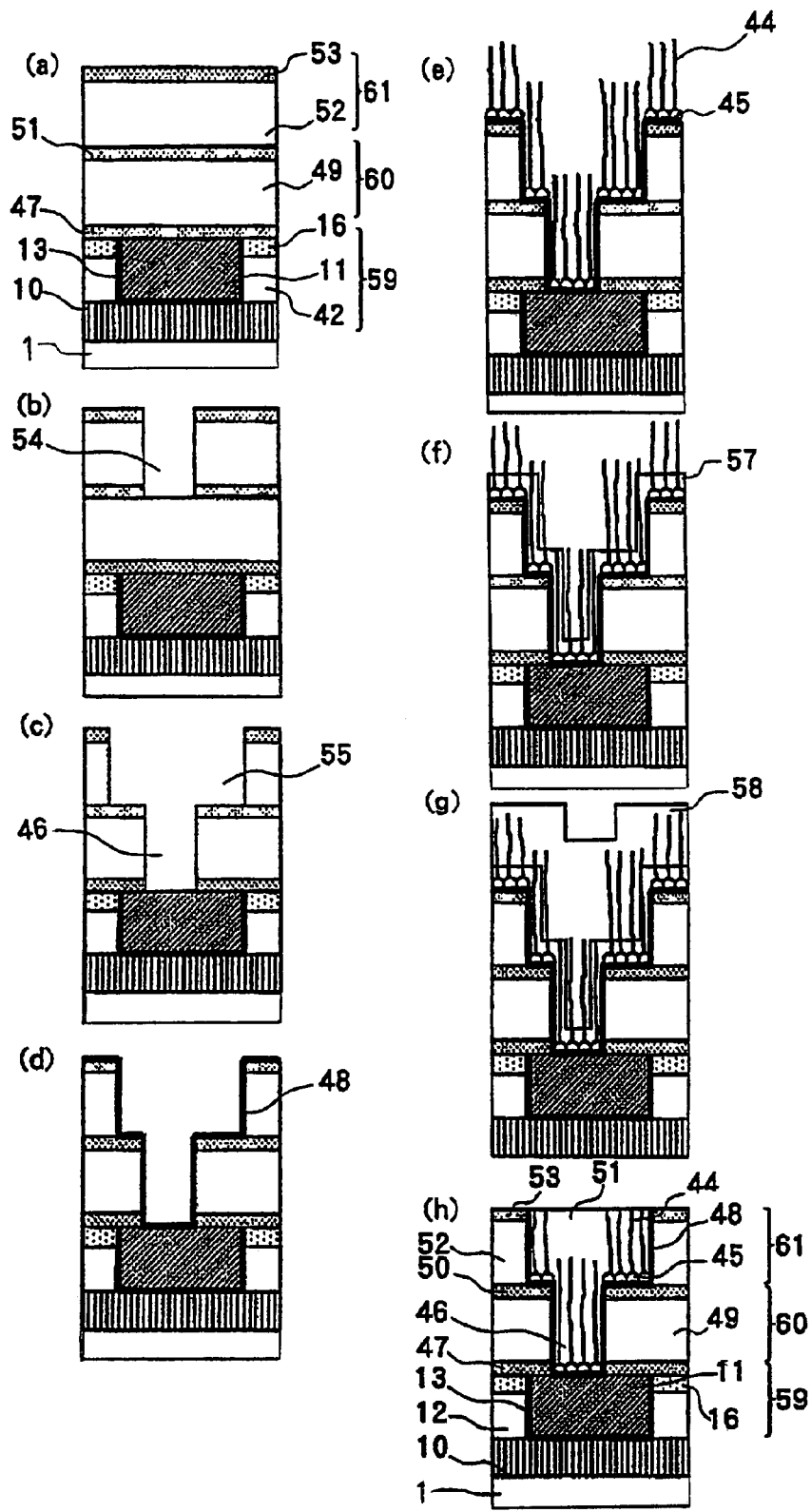
FIGS. 8(a) to 8(h) are each a schematic sectional view to show each step of a manufacturing method of an interconnection and a connection plug by the dual damascene process in the third embodiment of the present invention.

Next, the etching stopper layers 47, 51, 53, each formed from an SiC film having a film thickness of 30 nm, are formed and the interlayer dielectric film 49, 52 formed from a silicon oxide film having a film thickness of 600 nm are formed by the plasma CVD method in order: etching stopper layer 47, interlayer dielectric film 49, etching stopper layer 51, interlayer dielectric film 52, etching stopper layer 53 (FIG. 8(a)).

After that, a hole 54 that pierces through the etching stopper layer 51, the interlayer dielectric film 52 and the etching stopper layer 54 is formed by using a photolithography technique and an etching technique (FIG. 8(b)).

The hole 54 has the same pattern as a via hole 56. Next, an interconnection trench 55 is formed in the second interconnection layer 61 by using a photolithography technique and an etching technique. At this time, the pattern of the hole 54 is transferred to the interlayer dielectric film 49 and the via hole 56 is formed (FIG. 8(c)).

(Formation of Barrier Metal)

Ta having a film thickness of 10 to 30 nm is formed as the barrier metal layer 48 by the sputtering method on the whole surface of the substrate including the interconnection trench 55 and the via hole 56 (FIG. 8(d)).

(Formation of Carbon Nanotubes)

Ni which becomes the particles 45 and carbon nanotubes 44 are formed. The carbon nanotubes 44 are caused to grow to such an extent that they protrude from the via hole 56 (800 nm or so) (FIG. 8(e)).

(Formation of Interconnection and Connection Plug)

Cu having a film thickness of 30 nm is formed as a seed layer 57 (FIG. 8(f)), a metal layer 58 of 1370 nm formed from Cu is deposited by the plating method, and a Cu layer having a total thickness of 1400 nm is formed on the Ta film (FIG. 8(g)). The MOCVD method (the metal organic chemical vapor deposition method) may be used in the formation of the seed layer and the Cu layer.

The suppression of the occurrence of voids can be performed by the method described above.

Lastly, excess Cu layers, carbon nanotubes and Ni other than those in the via hole 55 are removed by use of the CMP method (the chemical mechanical polishing method), which is a conventional technique, and the interconnection 51 and the connection plug 46 are formed (FIG. 8(h)).

Fourth Embodiment

In the first to third embodiments, particles which become nuclei are formed on the bottom surface of a trench or a via which becomes an interconnection, carbon nanotubes are caused to grow on the nuclei and after that, a metal film is formed, whereby a trench interconnection structure is formed.

In this embodiment, after the formation of a trench which becomes an interconnection and the formation of a barrier metal layer, for example, in FIG. 4(c), an interconnection containing carbon nanotubes is formed by the plating method which involves using a plating liquid containing carbon nanomaterials (fibrous nanomaterials represented by single-layer and multi-layer/metallic, semiconducting and insulating carbon nanotubes etc., granular carbon nanomaterials represented by carbon nanohorns, fullerenes, etc., and nanomaterials such as a thin silicon wire).

By using the plating method of this embodiment which involves using a plating solution containing carbon nanotubes, it is possible to omit the step of forming particles and the step of forming carbon nanotubes, which are described in the first to third embodiments.

When copper is used in the trench interconnection structure, it is possible to use an ordinary copper sulfate-based plating liquid as the plating liquid for this embodiment. For example, a solution obtained by mixing 0.1 m of copper sulfate, 1.0 g/l of carbon nanotubes and a surfactant was used, and before plating, ultrasonic waves were applied for 10 minutes so that the carbon nanotubes are sufficiently dispersed in the plating solution. After that, electrolytic plating was performed under usual conditions. Incidentally, the dispersion by ultrasonic waves may be performed during plating.

The content of carbon nanotubes in the plating liquid, which depends on the content of carbon nanotubes required by the properties of a film formed by plating, is not less than 0.2 g/l, preferably not less than 0.5 g/l, and more preferably not less than 1.0 g/l. When the content is not less than 0.2 g/l, carbon nanotubes are dispersed in the film. It is not especially necessary to set an upper limit. However, an upper limit is not more than 25 g/l, preferably not more than 15 g/l, and more preferably not more than 10 g/l. When the upper limit is not more than 25 g/l, carbon nanotubes are uniformly dispersed in the plated film.

Incidentally, although electrolytic plating with copper is exemplified in this embodiment, it is possible to perform plating with other metals such as gold and silver with which plating is ordinarily performed.

As the electrolytic plating liquid for this embodiment, it is unnecessary to use a plating liquid particular to this embodiment, and it is possible to use commercially available plating liquids.

Furthermore, this embodiment can be adapted also to electroless plating.

Although carbon nanotubes are used as nanomaterials in this embodiment, fibrous nanomaterials represented by single-layer and multi-layer/metallic, semiconducting and insulating carbon nanotubes etc., granular carbon nanomaterials represented by carbon nanohorns, fullerenes, etc., and nanomaterials such as a thin silicon wire may also be used. When an interconnection containing carbon nanotubes is formed by the plating method which involves using a plating liquid containing carbon nanomaterials (fibrous nanomaterials represented by single-layer and multi-layer/metallic, semiconducting and insulating carbon nanotubes etc., granular carbon nanomaterials represented by carbon nanohorns, fullerenes, etc., and nanomaterials such as a thin silicon wire may be used), this produces a marked effect that voids do not occur in metal films formed as an interconnection and a via.

The invention claimed is:

1. A semiconductor device comprising:
   an insulating film (10);
   an interlayer dielectric film (12) on the insulating film;
   a trench (11) within the dielectric film;
   a first etching stopper layer (16) covering the dielectric film; and
   an interconnection, comprising,
   a metal layer (39) filling the trench,
   a barrier metal layer (13) coating a bottom and sides of the trench, the barrier metal layer located intermediate the metal layer and the dielectric film with the barrier metal layer separating the metal layer from the dielectric film,
   particles of metal (15) on a lower horizontal surface of the barrier metal layer, and
   carbon nanotubes (14) formed on the metal particles and mixed in the metal layer,
   wherein, each of i) the trench (11), ii) the interconnection, iii) the metal layer (39), iv) the barrier metal layer (13), and the carbon nanotubes (14) extend through the first etching stopper layer.

2. The semiconductor device according to claim 1, further comprising:
   a second etching stopper layer (27) formed on the etching stopper layer (16), on the barrier metal layer (13), and on part of the metal layer (39);
   another interlayer dielectric film (29) formed on the second etching stopper layer;
   a third etching stopper layer (30) formed on the another dielectric film;
   a via hole formed in the second etching stopper layer, the another dielectric film, and the third etching stopper layer;
   metal (26) filling the via hole;
   another barrier metal layer (28) covering a bottom and sides of the via hole and extending up to a top of the another dielectric film, the another barrier metal layer separating the metal filling the via hole from the bottom and sides of the via hole;
   further metal particles on the another barrier metal layer covering the bottom of the via hole;
   further carbon nanotubes (24) formed on further the metal particles and mixed in the metal filling the via hole,
   wherein, said metal filling the via hole, said further carbon nanotubes, and said another barrier metal layer define a connection plug contacting said interconnection.

3. The semiconductor device according to claim 1, wherein the carbon nanotubes are oriented substantially perpendicularly to the lower horizontal surface of the barrier metal layer.

4. The semiconductor device according to claim 1, wherein the carbon nanotubes are provided in the whole trench.

5. The semiconductor device according to claim 1, wherein the metal layer is formed by a plating liquid comprising the carbon nanotubes.

* * * * *